United States Patent [19]

Green

[11] 4,301,520

[45] Nov. 17, 1981

[54] DIFFERENTIAL ROW READOUT OF CID IMAGERS

[75] Inventor: Wayne T. Green, Mexico, N.Y.

[73] Assignee: General Electric Company, Syracuse, N.Y.

[21] Appl. No.: 166,408

[22] Filed: Jul. 7, 1980

[51] Int. Cl.³ .................. G11C 13/00; H01J 39/12
[52] U.S. Cl. .................. 365/189; 250/211 J; 357/24
[58] Field of Search ............. 365/183, 106, 114–115, 365/189; 250/211 J; 357/24, 32

[56] References Cited

U.S. PATENT DOCUMENTS 3,993,897  11/1976  Burke et al. ............. 250/211 J

Primary Examiner—Terrell W. Fears
Attorney, Agent, or Firm—Carl W. Baker; Richard V. Lang

[57] ABSTRACT

A row-read technique, utilizable with conventional CID array imagers, is provided for reading image intensity information from such imagers and for differentially cancelling noise common to all rows during production of an output signal representative of the information.

2 Claims, 12 Drawing Figures

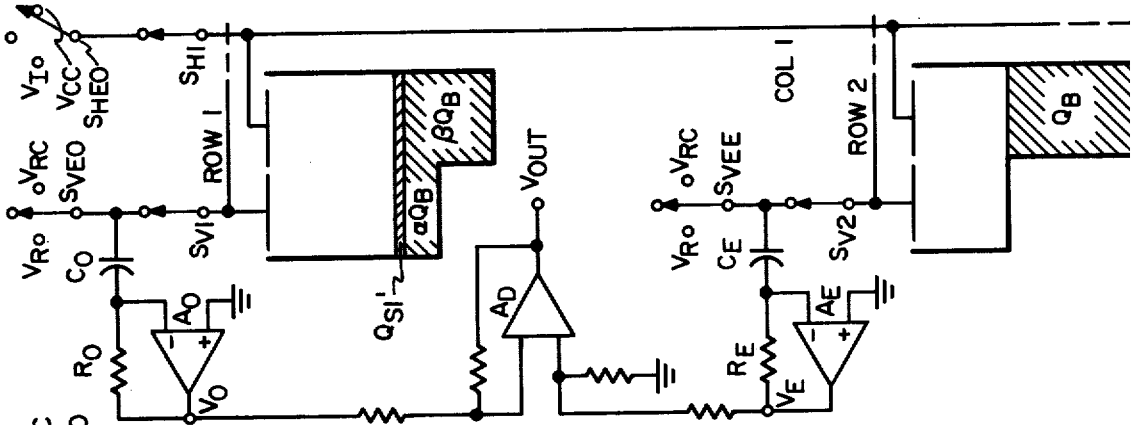
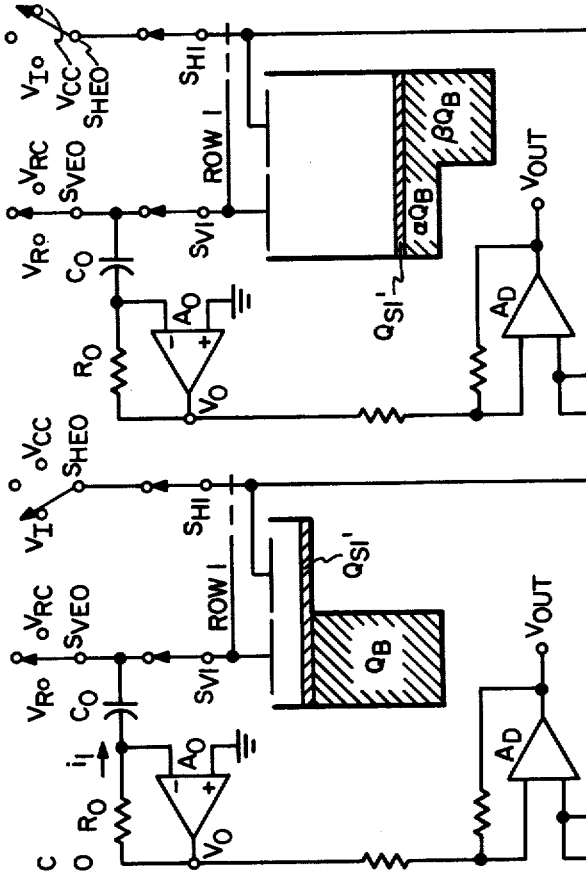
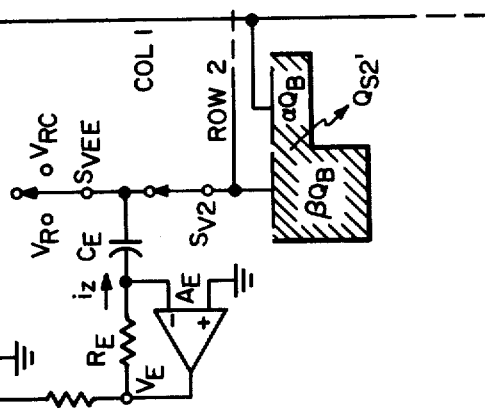
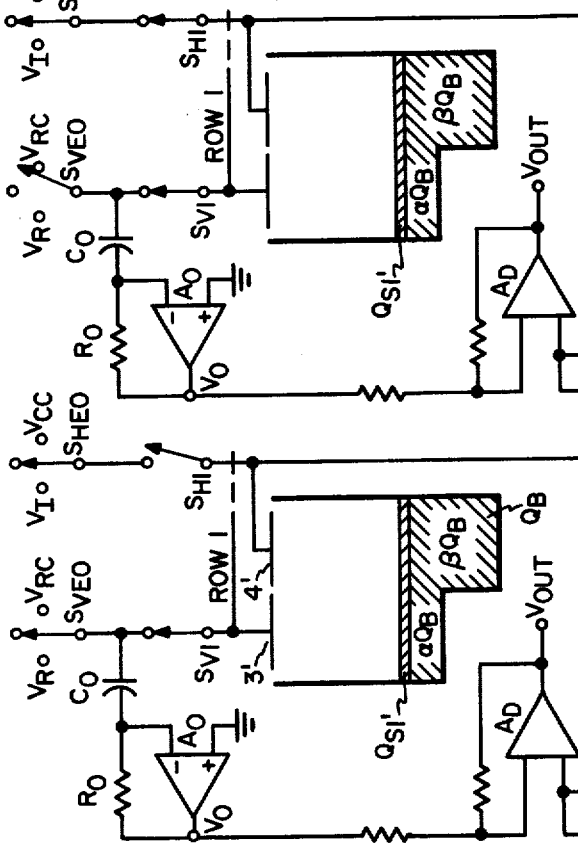
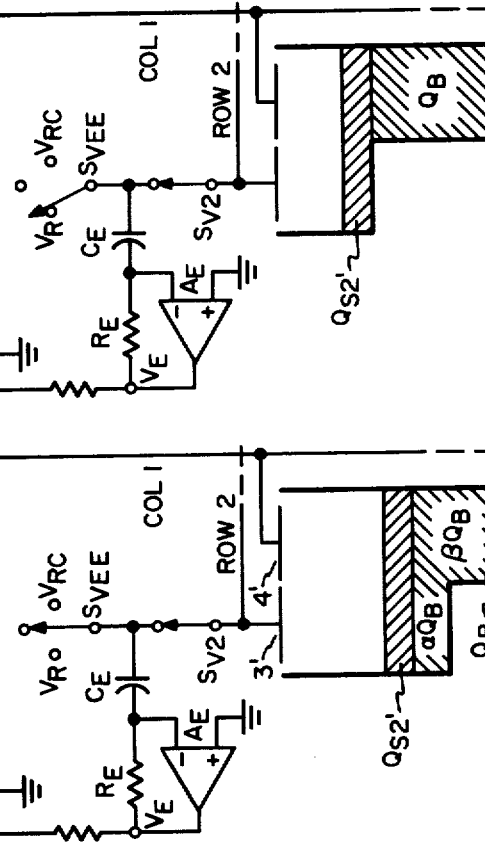
FIG. 3A  FIG. 3B  FIG. 3C  FIG. 3D

DIFFERENTIAL ROW READOUT OF CID IMAGERS

BACKGROUND OF THE INVENTION

1. Field of the Invention

This invention relates to solid state imagers and in particular to the readout of image information from charge transfer device arrays.

2. Description of the Prior Art

One of the most useful solid state image sensors is the CID (charge injection device) array. Such an array comprises a matrix of CID storage sites in which signal charges are collected in proportion to the intensity of incident radiation forming an image focused onto the array. The CID array has good antiblooming capabilities, is immune from image burn and has a higher modulation transfer function than other charge transfer devices such as CCDs. Despite these advantages, however, difficulties have been experienced in accurately reading the magnitudes of the charges collected at the discrete sites.

These difficulties can be best understood by referring to FIG. 1 which illustrates a conventional CID array and readout circuitry typically used for sensing the charges collected. The array 1 comprises a substrate of semiconductor material of one conductivity type supporting a layer of insulator material on which are formed a multiplicity of conductive pads. The array is geometrically divided into a plurality of charge storage sites, such as that indicated at 2, for collection of radiation-generated minority carriers. Each of the sites includes a pair of the pads, designated a row pad 3 and a column pad 4, and each pad defines a CIS (conductor, insulator, semiconductor) capacitive cell comprising the pad itself and the underlying portions of the insulator and semiconductor layers.

The two pads at each site are closely coupled, as is known in the art, to enable charge to be transferred between the capacitive cells in the site. The row pads in each row are electrically connected to a respective row line 5. Similarly, the column pads in each column are electrically connected to a respective column line 6. The row and column lines are each connected to a respective field effect transistor (FET) switch to enable individual accessing of the sites at selected row/column coordinates. The row lines are connected to row select switches $S_{Vm}$, where m designates the row number and the column lines are connected to column select switches $S_{Hn}$, where n designates the column number. FET switches $S_{Rm}$, connecting respective row lines to a terminal 13 when they are turned on, are provided to enable the simultaneous application of any desired reference potential to all row lines. These switches are turned on by applying a gate signal to their gates through a terminal 14.

Readout of image intensity information from the array is accomplished by applying vertical select pulses to the gates of the FETs connected to the row lines 5, and horizontal select pulses to the gates of the FETs connected to the column lines 6. The vertical and horizontal select pulses are applied in a predetermined sequence to effect sensing of the charges stored at all of the sites. The vertical select pulses are produced by a vertical shift register 7. These pulses sequentially select pairs of rows by turning on pairs of the FETs connected to the row lines, each pair including a FET connected to an odd-numbered row line and one connected to an even-numbered row line. Vertical enable signals VEO and VEE are applied during each vertical select pulse to two row terminals 9 and 10, respectively, and through the FETS connected to the selected pair of rows. The voltage levels of these signals are first established at magnitudes which effect distribution of the charges at the sites in the selected pair of rows such that one of the rows is enabled to be read and then established at magnitudes which effect redistribution of the charges such that the other selected row is enabled to be read.

While each row is thus enabled, the horizontal select pulses are produced by a horizontal shift register 8. These pulses successively select pairs of columns by turning on pairs of the FETs connected to the column lines, each pair including a FET connected to an odd-numbered column line and one connected to an even-numbered column line. During each horizontal select pulse, horizontal enable signals HEO and HEE are twice applied to two column terminals 11 and 12, respectively, and through the FETs connected to the selected pair of columns to effect sequential reading of the signal charges in the two sites located at the intersections of the selected columns and the enabled row. During the first application of the signals their magnitudes are established at a first set of voltage levels which effect injection into the substrate of the signal charge in the odd-column site. This injection causes production on one of the pads of the odd-column site of a signal representative of the magnitude of the signal charge injected at the site. During the second application of the horizontal enable pulses their magnitudes are established at a second set of voltage levels which effect injection into the substrate of the signal charge in the even-column site. This injection causes production on one of the pads of the even-column site of a signal representative of the magnitude of the signal charge injected at the site.

As the horizontal shift register sequentially selects pairs of columns and horizontal enable signals are applied, as described above, a signal representative of the signal charge injected at each site is successively produced on either the row or the column pad at each site in the row enabled to be read. The particular magnitudes chosen for the vertical and horizontal enable pulses determine the specific manner in which charge is distributed and redistributed at the site and consequently determine whether the changes in charge are produced on the row or the column pads. These changes in charge will be sensed at the row terminal connected to the enabled row in the former case and at the two column terminals in the latter case.

Techniques have been developed both for sensing the signals representing the injected charge at the column terminals (column read techniques) and for sensing such signals at the row terminals (row read techniques). Output signals produced by these techniques, however, contain noise components which it is desirable to eliminate. In the case of the column read techniques parasitic capacitance in the transistor switches used to connect the column pads to the column terminals couple switching transient signals from the horizontal shift register to the column terminals, and these transient signals appear in the output signal as a noise component commonly known as pattern noise.

It has been recognized that the pattern noise is duplicated each time the column switches are turned on to read a particular column. This duplication has been utilized in prior art attempts to eliminate pattern noise by reading each row twice. The first time a given row is read the output signal produced includes both signal voltages representing the magnitudes of signal charges injected at the individual sites and the pattern noise. The second time the row is read the output signal produced ideally includes only the pattern noise, because the charge collected at each site in the row in the short interval between the successive readings is normally too insignificant to effect production of any appreciable signal voltages during injection thereof. The pattern noise is eliminated by delaying the output signal produced during the first reading of a row, to cause time alignment with the output signal produced during the second reading, and by taking the difference between the magnitudes of the two signals.

The above-described delaying technique works well if the signal charge collected between successive readings is indeed insignificant, but this assumption is not valid for images with certain characteristics. For example, images including fast-moving light sources or light sources of rapidly changing intensity will cause the sudden collection of substantial signals charge in the affected sites in the row between successive readings. In this situation, the pattern noise will be eliminated, but spurious noise caused by these sudden collections of signal charge appears in the output signal.

In the case of the row read techniques the pattern noise must also be eliminated because it is coupled from the column lines to the row lines by the closely coupled row and column pads and by capacitance at crossover points of the row and column lines. Such elimination can be effectively accomplished by use of this technique, however, because information can be simultaneously read from two selected rows at the row terminals. By appropriately manipulating the voltage levels of the vertical and horizontal enable signals the charges in each site of the two selected rows can be continually redistributed such that the signals representing the injected charges and the pattern noises are sensed at one row terminal during reading of the row connected thereto while the pattern noise only is sensed at the other row terminal. The pattern noise is eliminated by producing an output signal representative of the real time difference between the magnitudes of the signals sensed at the two terminals.

Despite the success with which pattern noise can be eliminated by use of row read techniques, prior art adaptations thereof utilize sequences of enable signal voltage manipulations which introduce additional problems. For example, some row read techniques manipulate the voltage levels of the horizontal enable signals such that the voltages on the column lines are successively changed from a low-level charge collection potential to a higher-level charge redistribution potential, and the higher-level potential is maintained until the last column is read. After a substantial number of the column pads in the array have been raised to this potential, the potential of the unselected row pads tends to increase to a potential sufficient to cause premature injection of signal charges contained thereunder. To avoid such loss of signal charge it has been found necessary to add additional circuitry to the already complex CID array to clamp the unselected rows to a potential below that at which injection occurs. Because of this requirement for additional circuitry, this row read technique is not useable with conventional arrays such as that depicted in FIG. 1.

In other adaptations of the row read technique the voltage levels of the enable signals are manipulated such that the signal charges from all sites in the row being read are simultaneously injected into the semiconductor substrate. Changes in the row pad voltages representative of the signal charges injected at the respective sites are then sensed. Because of the substantial influx of charge into the semiconductor material a significant increase in voltage in experienced on all pads of the array. This voltage causes a temporary offset in the voltage levels on the row and column lines and causes an error in all output signals produced before the injected charge is dissipated in the substrate.

SUMMARY OF THE INVENTION

It is an object of the invention to provide a row read technique which can be utilized to accurately read image information from conventional as well as specially designed CID arrays.

It is another object to provide such a readout of information which does not promote premature injection at sites in unselected rows.

It is a further object to provide such a readout of information which minimizes the increase in substrate potential during injection.

These and other objects are accomplished by applying a sequence of enable signal voltages which maintains sufficient charge storage capacity at all sites to prevent premature injection and which limits intentional charge injection to that from the single site being read at any given instant. Each time a pair of rows is selected a READ potential is applied to first one of the row lines and then the other. While the READ potential is applied to the one row line an INJECTION potential is successively applied to each column line. The simultaneous occurrence of the READ and the INJECTION potentials on the row and column pads at each successive site in the row to which the READ potential is applied reduces the charge storage capacity at the site below that needed to hold the signal charge. This reduction causes injection of the signal charge contained in the site. The charge storage capacity at all other sites is maintained at a level sufficiently large to hold the signal charge contained therein.

BRIEF DESCRIPTION OF THE DRAWING

FIGS. 3A through 3D illustrate the sequence of events occurring during the reading of signal charge from the site located at row 2, column 1 of the CID array.

DESCRIPTION OF THE PREFERRED EMBODIMENT

To simplify explanation of the invention the utilization of a sequence of enable signal voltages to read signal charge in a single site will be explained with reference to the two charge storage sites located in column 1, rows 1 and 2. The charge redistribution at these two sites in successive time frames in which the sequence of enable signal voltages are applied is illustrated in FIGS. 2A–2D. The upper and lower portions of each figure illustrate the charge distribution in the row and column cells of the two sites when enable signals of specific potentials are applied to the row and column pads thereof. A simplified diagram of circuitry utilized to apply these voltages and of circuitry used to determine the magnitude of the signal charge at each site is also shown.

The distribution of charge at each site is determined by the depths of depletion regions formed under the row pad 3 and the column pad 4 by the application of enable signals to the pads. These depths also determine the charge storage capacity of each site. The charges contained in each site comprise a signal charge $Q_{S1}$ or $Q_{S2}$ collected during the interval since the site was last read and a bias charge $Q_B$. The bias charge is maintained at a predetermined magnitude which is identical in all sites and is defined as the maximum charge which a site can hold when the enable signal voltage causing signal charge injection (INJECTION potential) is applied to the column pad of the site being read.

Figure 1:
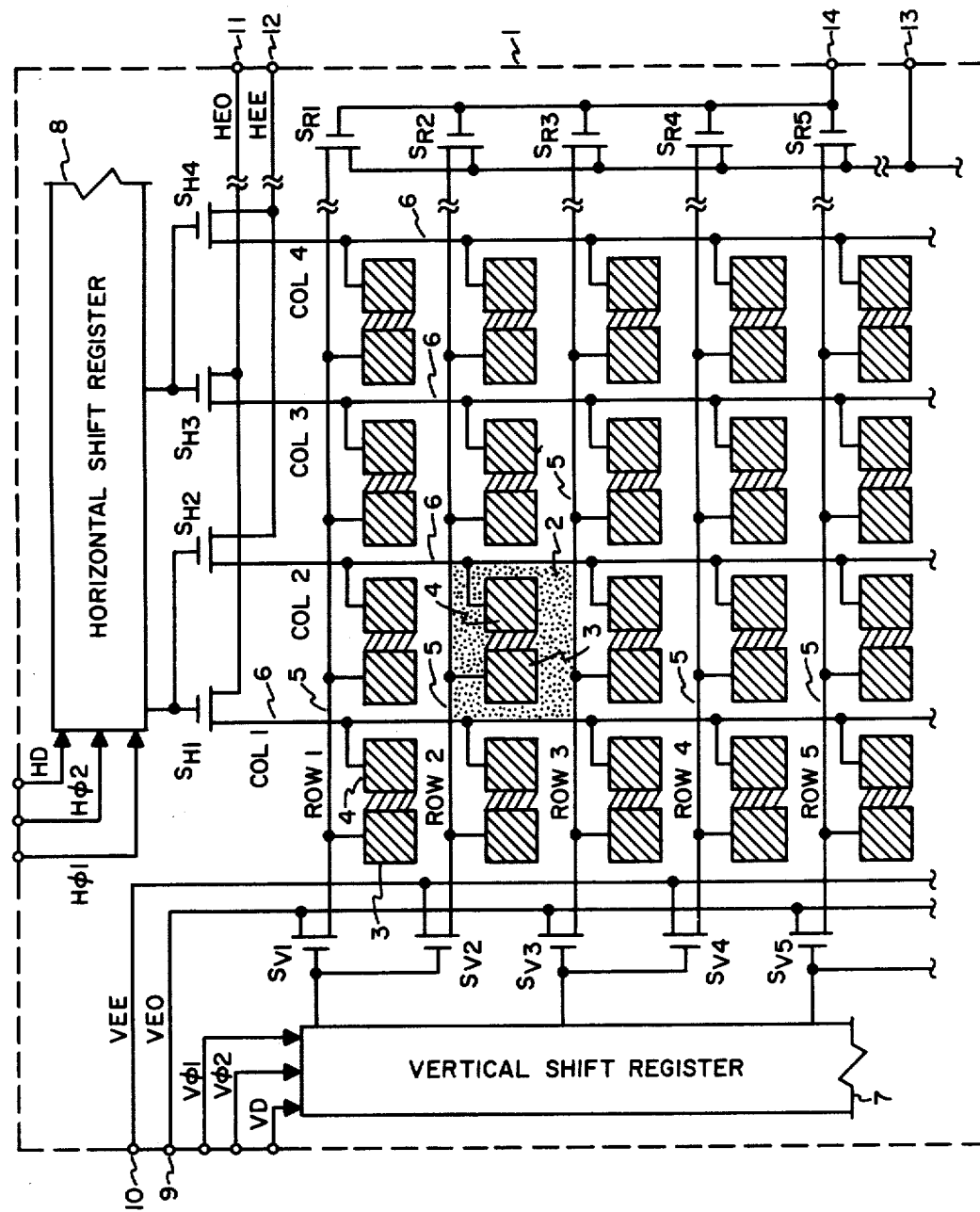
FIG. 1 is a schematic illustration of a typical CID array with which the invention may be utilized.
Figure 2A:
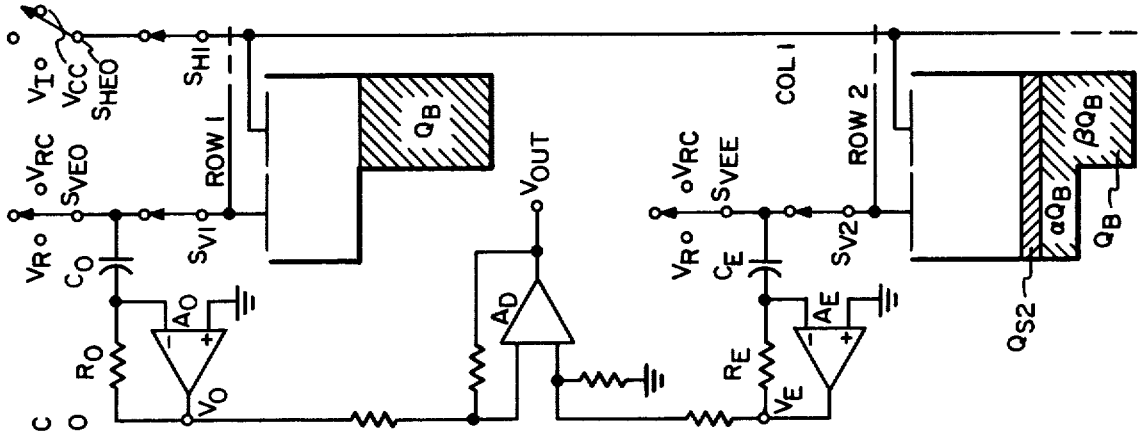
FIGS. 2A through 2D illustrate the sequence of events occurring during the reading of signal charge from a site located at row 1, column 1 of a CID array.

FIG. 2A illustrates the condition of the two sites just prior to selection. Selection of these sites will be accomplished by closing switches $S_{V1}$, $S_{V2}$, $S_{H1}$ which represent the transistor switches of FIG. 1 turned on by the vertical and horizontal select pulses to connect row lines 1, 2 and column line 1 to terminals 9, 10 and 11, respectively, at which the enable signals are provided. Switches $S_{VEO}$, $S_{VEE}$, $S_{HEO}$ represent additional transistor switches which are utilized to apply the appropriate sequence of enable signal voltages to the sites. The row pads at the two sites are floating at a ROW COLLECTION potential $V_{RC}$ to which they were periodically referenced during collection. Similarly, the column pads at the two sites are floating at a COLUMN COLLECTION potential $V_{CC}$ to which they were periodically referenced during collection. These potentials establish charge storage capacities in the two sites which are sufficient to inhibit injection of signal charge before the sites are selected to be read, and effect a predetermined distribution of the signal and bias charges. In each site the signal charge is evenly distributed between the row and column cells and the bias charge is distributed between the row and column cells in the fractional portions $\alpha Q_B$ and $\beta Q_B$ respectively, where $\alpha + \beta = 1$.

Figure 2B:
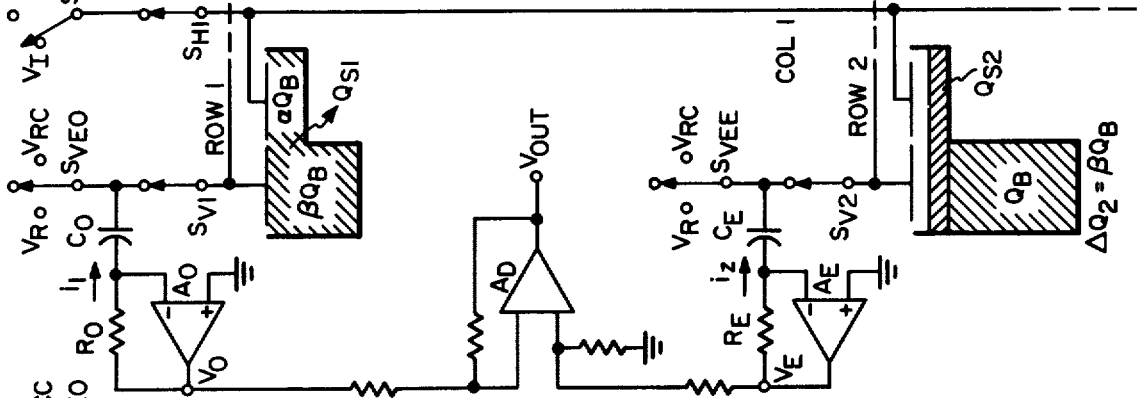

FIG. 2B illustrates the conditions of the two sites after they have been selected by closing switches $S_{V1}$, $S_{V2}$, $S_{H1}$. Row 1 is enabled to be read by application of a READ potential $V_R$ to row line 1 by switch $S_{VEO}$, row 2 is referenced to the ROW COLLECTION potential $V_{RC}$ by switch $S_{VEE}$ and column 1 is left floating at the COLUMN COLLECTION potential $V_{CC}$ by switch $S_{HEO}$. These three potentials establish charge storage capacities in the two sites such that the row 1 site is prepared for injection and the row 2 site is inhibited from injection. In the row 1 site the row cell capacity is reduced to a level at which the signal charge is evenly distributed between the row and column cells and the bias charge $Q_B$ is contained totally within the column cell. In the row 2 site the previously established charge storage capacities are maintained and both the signal charge and the bias charge are distributed as described for FIG. 2A.

It should be noted that the potential well configurations in FIG. 2B are applicable not only to the sites in column 1, rows 1 and 2, but to all sites in rows 1 and 2. This results because all column pads in the array are floating at the COLUMN COLLECTION potential $V_{CC}$, all row pads in row 1 are established at the READ potential applied to row line 1 and all row pads in row 2 are established at the ROW COLLECTION potential applied to row line 2. Thus, during the time interval represented by FIG. 2B, all sites in row 1 are prepared for signal charge injection, while all sites in row 2 are inhibited therefrom.

The enable signal voltages applied to the selected row lines through switches $S_{VEO}$, $S_{VEE}$ are not only established on all row pads connected to the row lines but also on capacitors $C_O$, $C_E$ each having one side connected to a respective one of the switches $S_{VEO}$, $S_{VEE}$. These capacitors are utilized to AC-couple signals developed on the selected odd and even row lines (rows 1 and 2 in the illustrated example) to respective amplifiers. Each of the capacitors $C_O$, $C_E$ couples the signals to the inverting input of an operational amplifier $A_O$, $A_E$, respectively. The inverting input of each amplifier $A_O$, $A_E$ is maintained at GROUND potential (to which the amplifiers non-inverting inputs are referenced) by respective feedback resistors $R_O$, $R_E$.

Figure 2C:
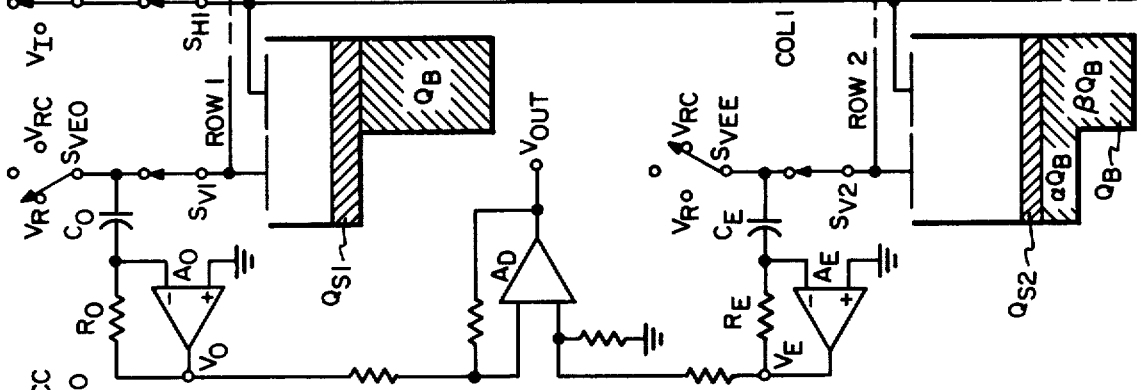

FIG. 2C illustrates the conditions of the two sites during the next event in the sequence. Switches $S_{VEO}$, $S_{VEE}$ are switched to open positions leaving the row pads at the sites in row 1 and row 2 floating at the READ potential and the ROW COLLECTION potential, respectively. Switch $S_{HEO}$ is switched to a position causing application of the INJECTION potential to the column pads in column 1. The potentials on the pads of the row 1 site establish a charge storage capacity precisely equal to the magnitude of the bias charge $Q_B$. All of the signal charge $Q_{S1}$ is injected into the substrate and the bias charge is distributed between the row and column cells in fractional portions $\beta Q_B$ and $\alpha Q_B$, respectively. The potentials on the pads of the illustrated row 2 site establish a charge storage capacity which is large enough to hold both the bias charge $Q_B$ and the signal $Q_{S2}$ contained therein. The signal charge is evenly distributed between the row and column cells and the bias charge is contained totally within the row cell.

Development of the output signal representative of the magnitude of the signal charge $Q_{S1}$ will now be explained. Note that during application of the INJECTION potential to column line 1, the magnitude of the charge under the row pad of the site in row 1 changes from the previously established magnitude of $\frac{1}{2} Q_{S1}$ to the magnitude of $\beta Q_B$ for a net change of charge $\Delta Q_1 = \beta Q_B - \frac{1}{2} Q_{S1}$. Simultaneously, the magnitude of the charge under the row pad of the site in row 2 changes from the previously established magnitude of $\frac{1}{2}Q_{S2} + \alpha Q_B$ to the magnitude of $\frac{1}{2}Q_{S2} + Q_B$ for a net change $\Delta Q_2 = (\frac{1}{2}Q_{S2} + Q_B) - (\frac{1}{2}Q_{S2} + \alpha Q_B) = Q_B - \alpha Q_B = \beta Q_B$. These changes in charge cause corresponding changes in the charges on the respective row pads by means of a current $i_1$ momentarily flowing through resistor $R_O$ and capacitor $C_O$ to the row 1 pad and a current $i_2$ momentarily flowing through resistor $R_E$ and capacitor $C_E$ to the row 2 pad. The two resistors have identical resistances of a magnitude which is much lower than the high impedance at the inputs of the operational amplifiers $A_O$, $A_E$ so none of the currents $i_1$, $i_2$ flow into the amplifiers. The amplitude of the voltage developed across the resistor $R_O$ by current $i_1$ is representative of $\Delta Q_1$ and is produced as a voltage signal $V_O$ by amplifier $A_O$. Similarly, the amplitude of the voltage developed across resistor $R_E$ by current $i_2$ is representative of $\Delta Q_2$ and is produced as a voltage signal $V_E$ by amplifier $A_E$. A third amplifier $A_D$, connected in a well known differential input configuration, receives the voltage signals $V_O$, $V_E$ at inputs thereof and produces an output signal $V_{OUT}$ representative of the difference $\Delta Q_2 - \Delta Q_1 = (\beta Q_B) - (\beta Q_B - \frac{1}{2}Q_{S1}) = \frac{1}{2}Q_{S1}$. The signals $V_O$, $V_E$ include pattern noise components coupled from the column 1 line to the amplifiers $A_O$, $A_E$, but these noise components are of equal magnitude and are cancelled by the differential operation of the amplifier $A_D$.

Figure 2D:
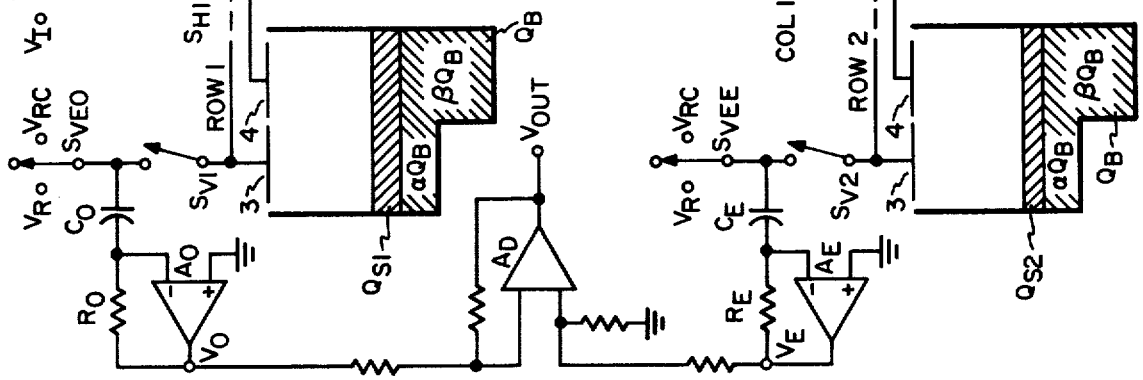

After the magnitude of the signal charge at the site in row 1, column 1 has thus been read, switch $S_{HEO}$ is switched to the position at which the COLUMN COLLECTION potential is reapplied to the column 1 line as is illustrated in FIG. 2D. The switches $S_{VEO}$, $S_{VEE}$ remain in the open position maintaining the READ potential on row line 1 and the ROW COLLECTION potential on row line 2. These three potentials reestablish the charge storage capacities that existed in the two sites during the time frame represented by FIG. 2B. The charge distribution in the two sites is also identical to that in FIG. 2B except for the absence of signal charge from the row 1 site.

In the row 1 site, the bias charge is contained totally within the column cell. The remainder of the site capacity is available for the signal charge that begins collecting at this time. This remaining capacity is greater than signal charge magnitudes normally collected between subsequent readings of the site, but it will be further increased after all sites in row 1 have been read and the voltage on row line 1 can be changed from the READ potential to the ROW COLLECTION potential. In the row 2 site, charge storage capacity is at a maximum.

After column line 1 has been returned to the COLUMN COLLECTION potential the events depicted in FIGS. 2C and 2D are repeated for each successive pair of sites in rows 1 and 2 to effect reading of the magnitudes of the signal charges in all sites in row 1. After this is complete, row line 1 is again referenced to the ROW COLLECTION potential $V_{RC}$.

Row 2 is next read in precisely the same manner as was described for row 1. This is shown in FIGS. 3A–3D which illustrate the sequence of enable signal voltages applied to read the signal charge at the site located at the intersection of row 2, column 1.

FIG. 3A illustrates the condition of the two sites at the intersections of column 1, rows 1 and 2, while rows 1 and 2 remain selected (switches $S_{V1}$, $S_{V2}$ closed) but just prior to selection of column 1 for the second time (switch $S_{H1}$ open). Note that the magnitude of the signal charges at both sites has changed slightly since the site in row 1 was read. The magnitude of the charge at the row 2 site has increased slightly from $Q_{S2}$ to $Q'_{S2}$ because of additional radiant energy received at the site. The row pads are floating at the ROW COLLECTION potential $V_{RC}$ to which they were referenced after row 1 was read. The column pads are floating at the COLUMN COLLECTION potential $V_{CC}$ to which they were referenced after column 1 was last read (see FIG. 2D). These potentials establish the charge storage capacities and signal charge distribution previously described for FIG. 2A.

FIG. 3B illustrates the conditions of the two sites after column 1 has again been selected by closing switch $S_{H1}$. Row 2 is now enabled to be read by application of the READ potential $V_R$ to row line 2 by switch $S_{VEE}$, row 1 is referenced to the ROW COLLECTION potential $V_{RC}$ by switch $S_{VEO}$ and column 1 is left floating at the COLUMN COLLECTION potential $V_{CC}$ by switch $S_{HEO}$. These three potentials establish charge storage capacities in the two sites such that the row 2 site is prepared for injection and the row 1 site is inhibited from injection. The charge storage capacities and charge distribution at the two sites is exactly opposite from that described for FIG. 2B.

FIG. 3C illustrates the conditions of the two sites during the next event in the sequence. Switches $S_{VEE}$, $S_{VEO}$ are switched to open positions leaving the row pads at all sites in row 2 and row 1 floating at the READ potential and the ROW COLLECTION potential, respectively. Switch $S_{HEO}$ is switched to a position causing application of the INJECTION potential to the column pads in column 1. The potentials on the pads of the illustrated row 2 site effect injection of the signal charge $Q'_{S2}$ into the substrate and the bias charge is distributed between the row and column cells in the fractional portions $\beta Q_B$ and $\alpha Q_B$, respectively. The potentials on the pads of the illustrated row 1 site establish a charge storage capacity which is large enough to hold both the bias charge $Q_B$ and the signal charge $Q'_{S1}$ contained therein. The signal charge is evenly distributed between the row and column cells and the bias charge is contained totally within the row cell.

The output signal representative of the magnitude of the signal charge $Q'_{S2}$ is produced in the same manner as was described for $Q_{S1}$. Application of the INJECTION potential to column line 1 causes a net change of charge under the row pad of the site in row 1 $\Delta Q'_1 = \beta Q_B$. Simultaneously, the magnitude of charge under the row pad of the site in row 2 undergoes a net change $\Delta Q'_2 = \beta Q_B - \frac{1}{2}Q'_{S2}$. The amplifier $A_D$ produces an output signal representative of the difference $\Delta Q'_2 - \Delta Q'_1 = -\frac{1}{2}Q'_{S2}$. Note that the output signal produced has negative polarity. This will be true of all output signals produced during reading of the second row in each selected pair. The amplifier outputs $V_O$, $V_E$ also include pattern noise components coupled from column line 1 which are cancelled by the differential operation of amplifier $A_D$.

After the magnitude of the signal charge at the site in row 2, column 1 has thus been read, switch $S_{HEO}$ is switched to the position at which the COLUMN COLLECTION potential is reapplied to column line 1 as is illustrated in FIG. 3D. The switches $S_{VEE}$ and $S_{VEO}$ remain in the open position maintaining a READ potential on row line 2 and the ROW COLLECTION on row line 1. These three potentials re-establish the charge storage capacities that existed in the two sites during the time frame represented by FIG. 3B. The charge distribution in the two sites is also identical to that in FIG. 3B except for the absence of signal charge from the row 2 site.

After column line 1 has been returned to the COLUMN COLLECTION potential the events depicted in FIGS. 3C and 3D are repeated for each successive pair of sites in rows 1 and 2 to effect reading of the magnitudes of the signal charges in all remaining sites in row 2. Upon completion of this READ operation, row line 2 is again referenced to the ROW COLLECTION potential. Row lines 1 and 2 are then maintained at this potential until the next time they are read. This does not occur until all other pairs of rows in the array are sequentially selected and read in the manner just described for rows 1 and 2.

Figure 4:
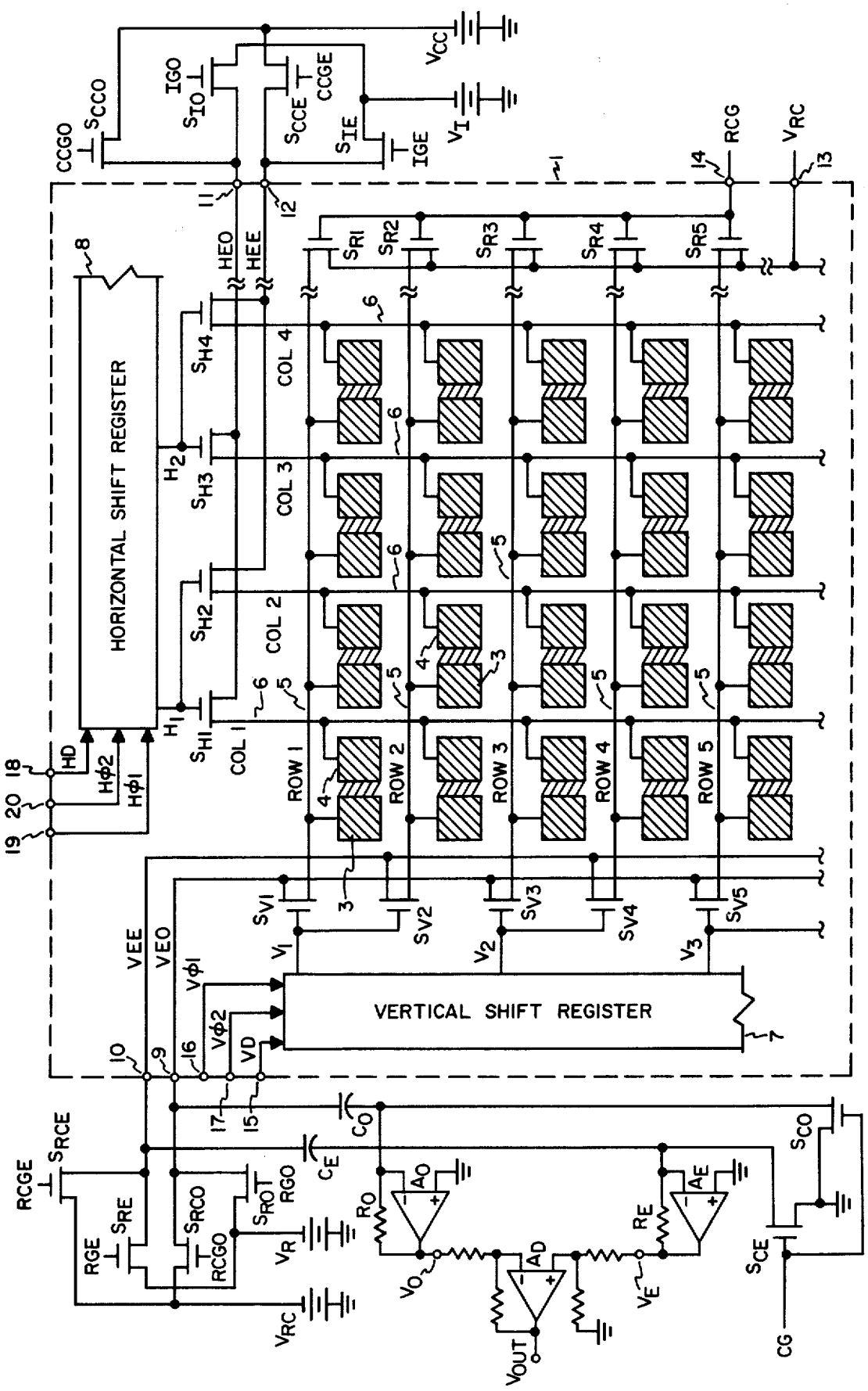
FIG. 4 is a schematic illustration of one form of circuitry which may be utilized with the array of FIG. 1 to implement the invention.

FIG. 4 illustrates a practical implementation of the above described method for determining the magnitudes of the signal charges at all sites in a 244 row x 248 column CID array. The figure includes the array illustrated in FIG. 1, switching circuitry utilized to apply the enable signals to the selected row and column lines and the amplifier circuitry utilized to produce the output signal $V_{OUT}$. The odd row enable signals are applied through the odd row terminal 9 and the odd-numbered row select switches to selected odd row lines by a pair of FET switches $S_{RO}$, $S_{RCO}$ corresponding to the switch $S_{VEO}$ depicted in FIGS. 2 and 3. Transistor switch $S_{RO}$ connects a source of the READ potential $V_R$ to terminal 9 whenever a READ gate odd (RGO) pulse is applied to the gate of the transistor, and transistor switch $S_{RCO}$ connects a source of the ROW COLLECTION potential $V_{RC}$ to terminal 9 whenever a ROW COLLECTION gate odd (RCGO) pulse is applied to the gate thereof. Similarly, the even row enable signals are applied through the even row terminal 10 and the even-numbered row select switches to selected even row lines by a pair of FET switches $S_{RE}$, $S_{RCE}$ corresponding to the switch $S_{VEE}$ depicted in FIGS. 2 and 3. Transistor switches $S_{RE}$, $S_{RCE}$ connect the sources of potential $V_R$, $V_{RC}$ to terminal 10 whenever a READ gate even (RGE) pulse or ROW COLLECTION gate even (RCGE) pulse is applied to the gate of the respective transistor.

The odd column enable signals are applied through the odd column terminal 11 and the odd column select switches to selected odd column lines by a pair of FET switches $S_{IO}$, $S_{CCO}$ corresponding to the switch $S_{HEO}$ depicted in FIGS. 2 and 3. Transistor switches $S_{IO}$, $S_{CCO}$ connect sources of potential $V_I$, $V_{CC}$ to terminal 11 whenever an INJECTION gate odd (IGO) pulse or COLUMN COLLECTION gate odd (CCGO) pulse is applied to the gate of the respective transistor. Similarly, the even column enable signals are applied through the even column terminal 12 and the even column switches to selected even column lines by a pair of FET switches $S_{IE}$, $S_{CCE}$. Transistor switches $S_{IE}$, $S_{CCE}$ connect sources of potential $V_I$, $V_{CC}$ to terminal 12 whenever an INJECTION gate even (IGE) pulse or COLUMN COLLECTION gate even (CCGE) pulse is applied to the gate of the respective transistor.

The row switches $S_{R1}$-$S_{R244}$ are periodically closed by application of a ROW COLLECTION gate (RCG) pulse to terminal 14 causing connection of the source of ROW COLLECTION potential $V_{RC}$ through terminal 13 to all row lines.

Figure 5A:
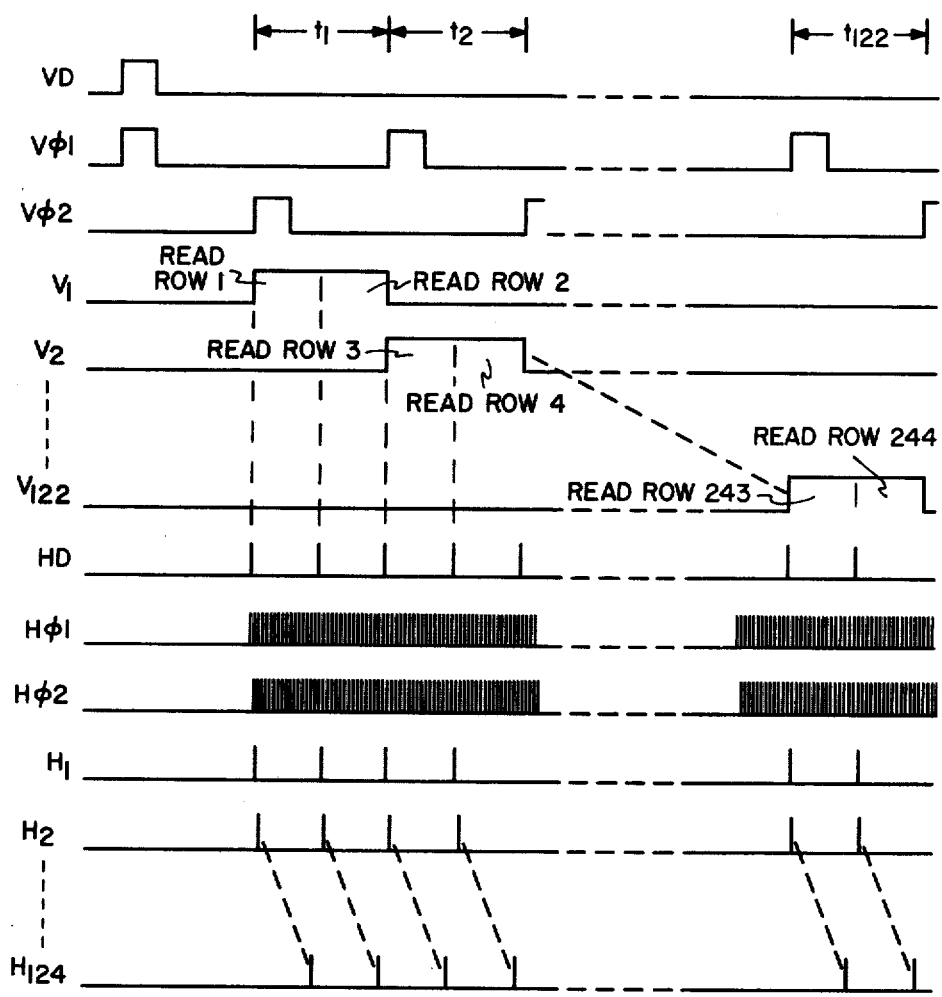
FIGS. 5A and 5B illustrate typical signals produced during reading of the array in accordance with the invention.

Operation of the circuitry in FIG. 4 will be explained with reference to FIGS. 5A and 5B which illustrate the timing relationships of signals produced during reading of the image intensity information from the array. FIG. 5A illustrates the sequence in which the vertical and horizontal select pulses are produced by vertical and horizontal shift registers, respectively. Each time it is desired to read the magnitudes of the signal charges in the array a vertical data pulse VD representing a logical ONE is applied through the terminal 15 to an input of the vertical shift register 7. This logical ONE is shifted through the shift register 7 by alternately-occurring vertical clock pulses $V\phi 1$, $V\phi 2$ applied through terminals 16, 17 to respective inputs of the shift register 7. On the occurrence of each successive vertical clock pulse, the logical ONE is shifted to the next successive stage of the shift register causing the output of the stage to produce a vertical select pulse. Each vertical select pulse is produced for a time interval beginning with the occurrence of one vertical clock pulse and ending with the occurrence of the next vertical clock pulse. For example, a vertical select pulse designated $V_1$ is produced during a time interval $t_1$ to effect selection of the pair of rows 1, 2. Similarly, vertical select pulses designated $V_2$ through $V_{122}$ are produced during successive time intervals $t_2$-$t_{122}$ to effect selection of the pairs of rows 3, 4-243, 244.

During the existence of each vertical select pulse two successive horizontal data pulses HD, each representing a logical ONE, are applied through a terminal 18 to an input of the horizontal shift register 8. The first horizontal data pulse occurs at the beginning of the respective vertical select pulse and the second horizontal data pulse occurs at the center of the vertical select pulse. Each of these logical ONES are shifted through the horizontal shift register 8 by alternately-occurring horizontal clock pulse $H\phi 1$, $H\phi 2$ applied through terminals 19, 20 to the respective inputs of the shift register 8. On the occurrence of each successive horizontal clock pulse the logical ONE in the shift register is shifted to the next successive stage causing the output of the stage to produce a horizontal select pulse. Sets of horizontal select pulses designated $H_1$-$H_{124}$ are produced twice during each of the time intervals $t_1$-$t_{122}$ to twice effect selection of the pairs of columns 1, 2-247, 248. Two sets of horizontal select pulses are produced during each vertical select pulse so that the two rows selected by each vertical select pulse can be read.

Figure 5B:
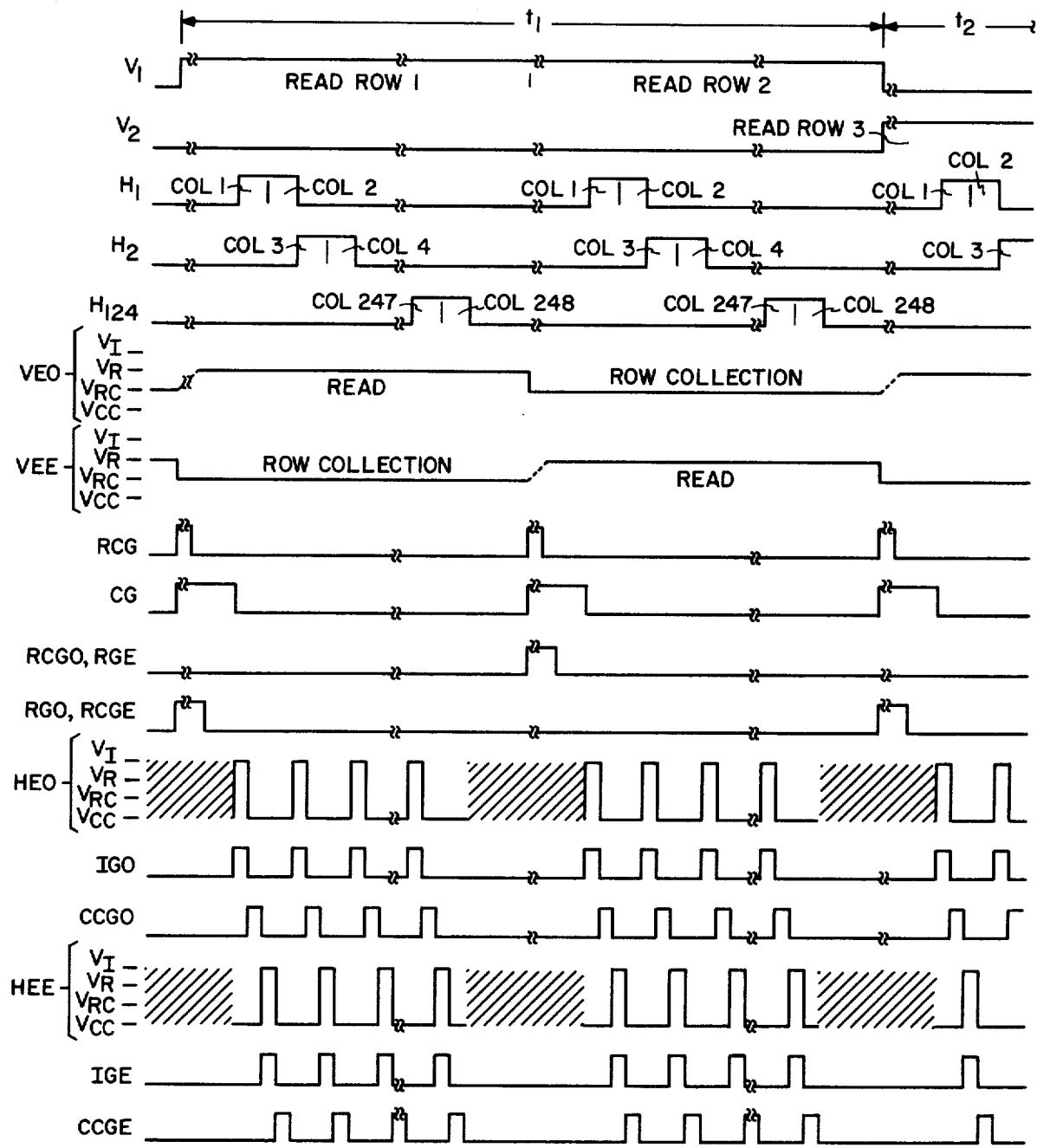

FIG. 5B illustrates the time relationships between the vertical/horizontal select pulses and the remainder of the signals produced during reading of the array. The figure covers only time intervals $t_1$ and a portion of time interval $t_2$, but the signals illustrated are repetitious and the figure can easily be expanded to cover all 122 time intervals occurring during reading of the array.

Reading of the array begins with production of the first vertical select pulse $V_1$ during which transistor switches $S_{V1}$, $S_{V2}$ are turned on connecting row lines 1, 2 to terminals 9, 10, respectively. The pulses RCG, CG, RGO, RCGE are initiated simultaneously with the beginning of the $V_1$ pulse. The RGO, RCGE pulse closes switches $S_{RO}$, $S_{RCE}$ causing the enable signals VEO, VEE at terminals 9, 10 to assume the READ potential, ROW COLLECTION POTENTIAL, respectively. These potentials are applied to row lines 1, 2 and to the capacitors $C_O$, $C_E$ establishing the previously described charge storage capacities which will enable injection of the charges in sites of row 1 and inhibit the injection of the charges in the sites of row 2. The RCG pulse closes switches $S_{R1}$-$S_{R244}$ causing the ROW COLLECTION potential to be applied to the row lines to ensure that the injection-inhibiting charge storage capacities are established in the sites of the unselected rows. Note that this pulse terminates prior to the RGO, RCGE pulse. This is necessary to ensure that the READ potential applied to row 1 through switches $S_{RO}$ and $S_{V1}$ continues longer than the ROW COLLECTION potential applied to row 1 through switch $S_{R1}$. The CG pulse turns on the two switches $S_{CO}$, $S_{CE}$ which provide a path to ground from the amplifier connected side of each of the capacitors $C_O$, $C_E$ to assist the amplifiers $A_O$, $A_E$ in rapidly establishing the READ and ROW COLLECTION potentials on the capacitors.

Immediately after termination of the pulses RCG, CG, RGO, RCGE, and during the first half of the vertical select pulse $V_1$, the first set of 124 horizontal select pulses ($H_1$-$H_{124}$) are produced. Each of these horizontal select pulses closes a pair of the column select switches $S_{H1}$, $S_{H2}$-$S_{H247}$, $S_{H248}$ connecting an odd and even column line to terminals 11, 12, respectively. During the first quarter of each horizontal select pulse, an IGO pulse is applied to the gate of switch $S_{IO}$ causing the enable signal HEO to assume the INJECTION potential. This potential is applied through the odd numbered one of the closed horizontal select switches to the selected odd column line causing signal charge injection at the selected site. During the second quarter of each of the horizontal select pulses, the CCGO pulse is applied to the gate of switch $S_{CCO}$ causing the enable signal HEO to assume the COLUMN COLLECTION potential which is established on the selected odd column line through the closed column select switch. During the third and fourth quarters of each of the horizontal select pulses and the IGE and CCGE pulses are produced causing the HEE signal to change potentials in the same manner as just described for HEO, causing the injection of the charge at the selected even column site followed by return of the even column line to the COLUMN COLLECTION potential.

After the signal charges at all sites of the first row have been injected and the output signal $V_{OUT}$ representative thereof has been produced, reading of the second row is achieved by production of the pulses RCG, CG, RCGO, RGE. The pulses RCG, CG function in the manner previously described, but the pulse RCGO, RGE establishes the READ potential on row 2 and the ROW COLLECTION potential on row 1. Immediately after termination of these pulses and during the second half of the vertical select pulse $V_1$, the second set of 124 horizontal select pulses ($H_1$-$H_{124}$) are produced. The potentials of the HEO and HEE signals are again changed in the above described manner to effect injection of the signal charges in row 2 and production of the output signal $V_{OUT}$ representative thereof.

Thus a method and apparatus have been provided for effectively utilizing row read techniques to read image information from CID arrays. The information is read out without causing premature injection at unselected sites because the sequence of horizontal enable signals utilized causes each column line to be returned to the COLUMN COLLECTION potential immediately after the INJECTION potential is applied thereto and thus the tendency of the potential of the unselected row pads to increase is prevented. The sequence of enable signal voltages applied also limits the magnitude of charge injected into the substrate at any instant to that from a single site and no increase in substrate potential is experienced.

Although a specific embodiment of the present invention has been disclosed, it is to be understood that it is only illustrative and the scope of the invention is to be determined from the appended claims.

I claim:

1. A method for reading image intensity information from charge storage sites in a row/column oriented CID array imager, and for differentially cancelling noise common to all rows during production of an output signal representative of the information, said reading being accomplished by determining the magnitudes of signal charges collected at the charge storage sites in response to incident radiation, each site including a row and a column cell, said method comprising:

a. selecting a first and second row of charge storage sites;
b. selecting first and second sites located in an identical column of the respective rows;
c. establishing a READ potential on the row cell of the first site, a ROW COLLECTION potential on the row cell of the second site and a COLUMN COLLECTION potential on the column cells of both sites, said READ potential establishing a charge storage capacity in the first site which is lower than that established in the second site by the ROW COLLECTION potential;
d. applying an INJECTION potential to the column cells of both sites while maintaining the READ and the ROW COLLECTION potentials on the row cells of the first and second sites, respectively, said INJECTION potential reducing the charge storage capacities of both sites, the capacity of the first site being reduced to a magnitude which is insufficient to hold signal charge, thus causing injection of the signal charge contained therein, while the capacity of the second site is reduced to a magnitude which is still sufficient to hold the signal charge contained therein;
e. re-establishing the COLUMN COLLECTION potential on the column cells of both sites;
f. repeating steps b through e for all sites in the selected rows;
g. selecting first and second sites located in an identical column of the respective rows;
h. establishing a READ potential on the row cell of the second site, a ROW COLLECTION potential on the row cell of the first site and a COLUMN COLLECTION potential on the column cells of both sites, said READ potential establishing a charge storage capacity in the second site which is lower than that established in the first site by the ROW COLLECTION potential;
i. applying an INJECTION potential to the column cells of both sites while maintaining the READ and the ROW COLLECTION potentials on the row cells of the second and the first sites, respectively, said INJECTION potential reducing the charge storage capacities of both sites, the capacity of the second site being reduced to a magnitude which is insufficient to hold signal charge, thus causing injection of the signal charge contained therein, while the capacity of the first site is reduced to a magnitude which is still sufficient to hold the signal charge contained therein;
j. re-establishing the COLUMN COLLECTION potential on the column cells of both sites;
k. repeating steps g through j for all sites in the selected rows;
l. repeating steps a through k until all sites have been read; and
m. producing the output signal by taking the differences between the magnitudes of signals representative of currents flowing from the selected sites during applications of the INJECTION potential, said differences in magnitude representing the signal charges injected by the sites in the row to which the READ potential is being applied.

2. A method for periodically reading image intensity information from M rows x N columns of charge storage sites in a CID array imager, and for differentially cancelling noise common to all rows during production of an output signal representative of the information, said reading being accomplished by determining the magnitudes of signal charges collected at the charge storage sites in response to incident radiation, the array comprising a substrate of semiconductor material supporting a layer of insulator material on which are formed at each site a row pad and a column pad, each pad defining a capacitive cell comprising the pad itself and the underlying portions of the insulator and semiconductor layers, the row pads for each row of sites being interconnected by a conductive row line and the column pads for each column of sites being interconnected by a conductive column line, said method comprising:

a. selecting a first and second row line;

b. applying a READ potential to the first row line and a ROW COLLECTION potential to the second row line, while all column lines are maintained at a COLUMN COLLECTION potential, said potentials establishing charge storage capacities in the sites of the selected rows such that in each site of the first row the signal charge collected since the site was last read is evenly distributed between the row and column cells and a bias charge of predetermined magnitude $Q_B$ maintained in every site is contained totally within the column cell, and in each site of the second row the signal charge collected since the site was last read in evenly distributed between the row and column cells and the bias charge is distributed between the row and column cells in fractional portions $\alpha Q_B$ and $\beta Q_B$, respectively, where $\alpha + \beta = 1$;

c. successively applying an INJECTION potential to the column lines while maintaining the READ and the ROW COLLECTION potentials on the selected row lines, said potentials successively establishing charge storage capacities in the sites of the selected rows such that in each site of the first row the signal charge is injected into the semiconductor layer and the bias charge is distributed between the row and column cells in fractional portions $\beta Q_B$ and $\alpha Q_B$, respectively, and in each site of the second row the signal charge is evenly distributed between the row and column cells and the bias charge $Q_B$ is contained totally within the row cell;

d. applying a COLUMN COLLECTION potential to each column line after injection of the charge at the first row site in said column, while maintaining the READ and the ROW COLLECTION potentials on the selected row lines, said applications of COLUMN COLLECTION potential establishing charge storage capacities in the sites of the selected rows such that in each site of the first row the bias charge is contained totally within the column cell and in each site of the second row the signal charge is evenly distributed between the row and column cells and the bias charge is distributed between the row and the column cells in fractional portions $\alpha Q_B$ and $\beta Q_B$, respectively;

e. applying a READ potential to the second row line and a ROW COLLECTION potential to the first row line, while all column lines are maintained at a COLUMN COLLECTION potential, said potentials establishing charge storage capacities in the sites of the selected rows such that in each site of the second row the signal charge collected since the site was last read is evenly distributed between the row and column cells and a bias charge of predetermined magnitude $Q_B$ maintained in every site is contained totally within the column cell, and in each site of the first row the signal charge collected since the site was last read is evenly distributed between the row and column cells and the bias charge is distributed between the row and column cells in fractional portions $\alpha Q_B$ and $\beta Q_B$, respectively;

f. successively applying an INJECTION potential to the column lines while maintaining the READ and the ROW COLLECTION potentials on the selected row lines, said potentials successively establishing charge storage capacities in the sites of the selected rows such that in each site of the second row the signal charge is injected into the semiconductor layer and the bias charge is distributed between the row and column cells in fractional portions $\beta Q_B$ and $\alpha Q_B$, respectively, and in each site of the first row the signal charge is evenly distributed between the row and column cells and the bias charge $Q_B$ is contained totally within the row cell;

g. applying a COLUMN COLLECTION potential to each column line after injection of the charge at the second row site in the column, while maintaining the READ and the ROW COLLECTION potentials on the selected row lines, said applications of COLUMN COLLECTION potential establishing charge storage capacities in the sites of the selected rows such that in each site of the second row the bias charge is contained totally within the column cell, and in each site of the first row the signal charge is evenly distributed between the row and column cells and the bias charge is distributed between the row and the column cells in fractional portions $\alpha Q_B$ and $\beta Q_B$, respectively;

h. re-establishing the ROW COLLECTION potential on the second row line while maintaining the ROW COLLECTION potential on the first row line and the COLUMN COLLECTION potential on the column lines, said potentials establishing charge storage capacities in the sites of the first and second rows which is adequate to prevent signal charge injection at these sites when other pairs of rows are selected;

i. repeating steps a through h until the signal charges in all sites of the array have been injected; and j. producing the output signal by taking the difference between the magnitudes of signals representative of currents flowing from the selected rows during applications of the INJECTION potential, said differences in magnitude representing the signal charges injected by the sites in the row to which the READ potential is being applied.

* * * * *